(12) United States Patent
Shiobara

(10) Patent No.: US 9,891,524 B2
(45) Date of Patent: Feb. 13, 2018

(54) SEMICONDUCTOR DEVICE AND METHOD OF MANUFACTURING THE SAME

(71) Applicant: Kabushiki Kaisha Toshiba, Minato-ku (JP)

(72) Inventor: Eishi Shiobara, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 69 days.

(21) Appl. No.: 14/835,868

(22) Filed: Aug. 26, 2015

(65) Prior Publication Data

US 2016/0216609 A1    Jul. 28, 2016

(30) Foreign Application Priority Data

Jan. 23, 2015    (JP) .................. 2015-011455

(51) Int. Cl.
*G03F 7/20*    (2006.01)
*G03F 7/32*    (2006.01)
*G03F 7/11*    (2006.01)
*G03F 7/028*    (2006.01)
*G03F 7/004*    (2006.01)

(52) U.S. Cl.
CPC .......... *G03F 7/2022* (2013.01); *G03F 7/0045* (2013.01); *G03F 7/028* (2013.01); *G03F 7/11* (2013.01); *G03F 7/2004* (2013.01); *G03F 7/2059* (2013.01); *G03F 7/32* (2013.01)

(58) Field of Classification Search
CPC ....................................................... G03F 7/20
See application file for complete search history.

(56) References Cited

U.S. PATENT DOCUMENTS 8,722,840 B2    5/2014  Sakamoto et al.
8,883,405 B2 *  11/2014 Shiobara ............... G03F 7/0045
                                                          430/322
2009/0123878 A1    5/2009  Miyoshi et al.
2013/0141708 A1*   6/2013  Sakurai .................. B82Y 10/00
                                                          355/67
2013/0164691 A1    6/2013  Shiobara

FOREIGN PATENT DOCUMENTS

| JP | 2009-105218 | 5/2009 |
| JP | 4564977 | 10/2010 |
| JP | 2013-135066 | 7/2013 |
| TW | 200707122 A | 2/2007 |
| TW | 200728908 A | 8/2007 |
| TW | 201327057 A1 | 7/2013 |
| TW | 201518362 A | 5/2015 |
| WO | WO 2012/067040 A1 | 5/2012 |

OTHER PUBLICATIONS

Combined Taiwanese Office Action and Search Report dated May 20, 2016 in Patent Application No. 104127051 (with English translation).

* cited by examiner

*Primary Examiner* — Kathleen Duda
(74) *Attorney, Agent, or Firm* — Oblon, McClelland, Maier & Neustadt, L.L.P.

(57) ABSTRACT

According to one embodiment, a method of manufacturing a semiconductor device, includes forming an energy-ray-curable resin layer containing a sensitizer for increasing sensitivity to exposure light, on an underlayer region including a semiconductor substrate, irradiating the energy-ray-curable resin layer with energy rays to form a lower layer film containing the sensitizer, forming a resist film on the lower layer film, diffusing the sensitizer from the lower layer film into the resist film by thermal treatment, irradiating the resist film in which the sensitizer is diffused with exposure light, and developing the resist film irradiated with the exposure light.

10 Claims, 4 Drawing Sheets

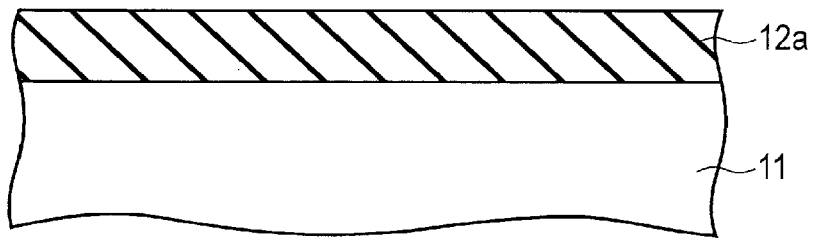
F I G. 1
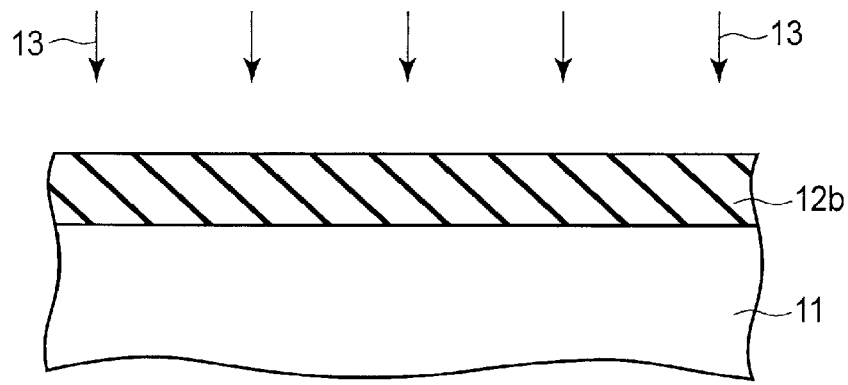
F I G. 2
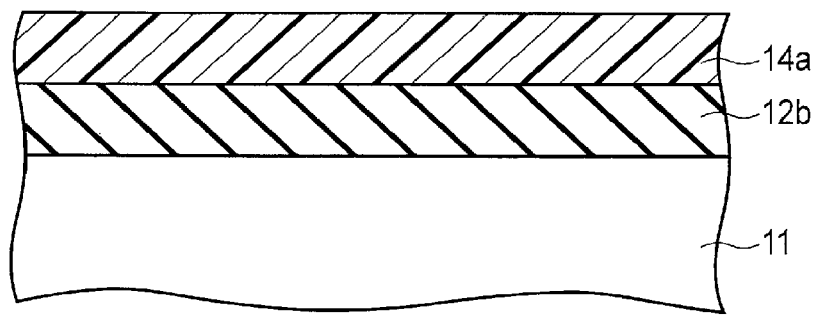
F I G. 3

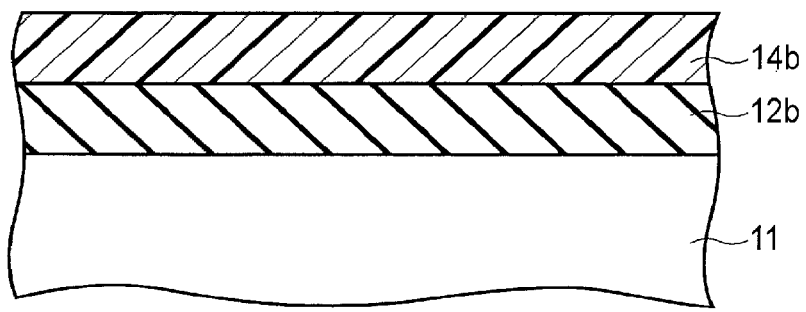
F I G. 4
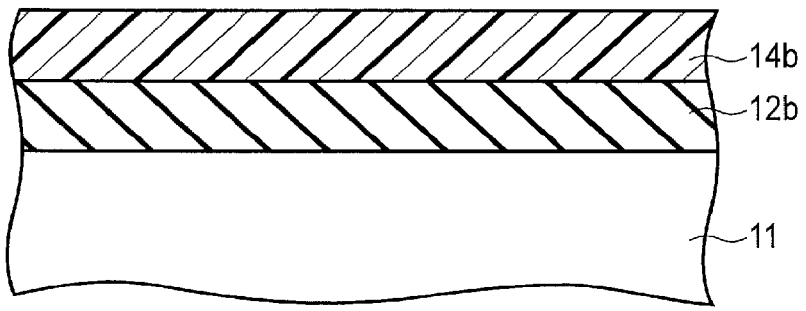
F I G. 5
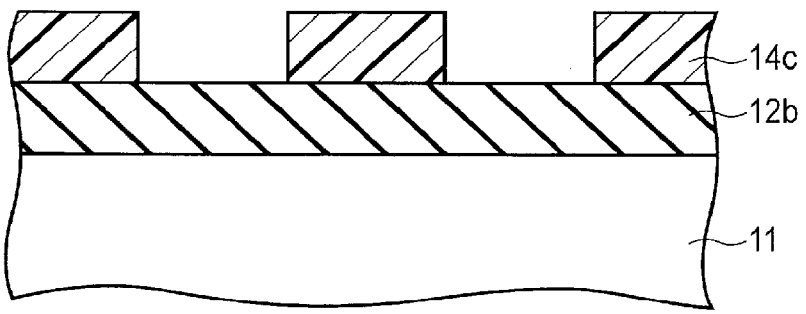
F I G. 6

Depth from upper surface of resist film

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2015-011455, filed Jan. 23, 2015, the entire contents of which are incorporated herein by reference.

FIELD

Embodiments described herein relate generally to a semiconductor device and a method of manufacturing the same.

BACKGROUND

Lithographic technology using extreme ultraviolet (EUV) light as exposure light to implement miniaturization of a semiconductor device, has been proposed.

In EUV lithography, increase in sensitivity of a resist film becomes important since an output of an EUV light source can hardly be increased. For this reason, containing a substance which increases absorption of the exposure light in the resist film has been proposed. However, if a light absorption coefficient is constant in a thickness direction of the resist film, an amount of absorbed light is decreased from a top surface toward a bottom surface of the resist film. Thus, a sufficient exposure amount can hardly be secured along the thickness direction of the resist film.

A method of disposing a lower layer film containing a sensitizer which increases the sensitivity to the exposure light under the resist film and diffusing the sensitizer from the lower layer film into the resist film has been proposed as a solution to such a problem. To prevent mixing of the lower layer film and the resist film, however, the lower layer film needs to be sufficiently cured at a high temperature prior to formation of the resist film. In other words, the lower layer film needs to be cured at a temperature higher than a temperature at which the sensitizer is diffused from the lower layer film into the resist film. Thus, a problem arises that the sensitizer can hardly be diffused from the lower layer film into the resist film.

A method of urging the sensitizer to be sufficiently contained into the resist film is therefore desired.

BRIEF DESCRIPTION OF THE DRAWINGS

FIG. 1 is a cross-sectional view pictorially showing in part a method of manufacturing a semiconductor device of the embodiments.

FIG. 2 is a cross-sectional view pictorially showing in part the method of manufacturing the semiconductor device of the embodiments.

FIG. 3 is a cross-sectional view pictorially showing in part the method of manufacturing the semiconductor device of the embodiments.

FIG. 4 is a cross-sectional view pictorially showing in part the method of manufacturing the semiconductor device of the embodiments.

FIG. 5 is a cross-sectional view pictorially showing in part the method of manufacturing the semiconductor device of the embodiments.

FIG. 6 is a cross-sectional view pictorially showing in part the method of manufacturing the semiconductor device of the embodiments.

DETAILED DESCRIPTION

Figure 7:
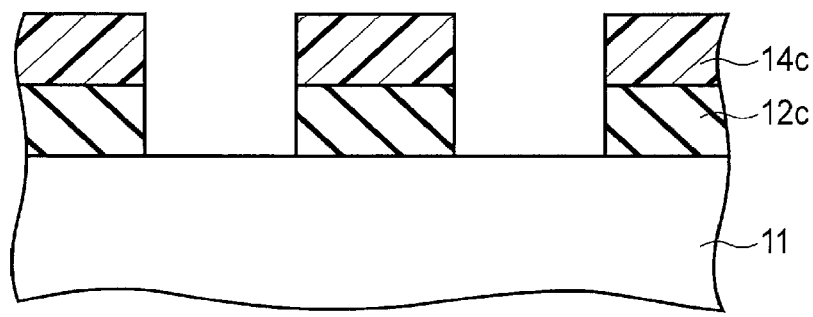
FIG. 7 is a cross-sectional view pictorially showing in part the method of manufacturing the semiconductor device of the embodiments.

In general, according to one embodiment, a method of manufacturing a semiconductor device, includes: forming an energy-ray-curable resin layer containing a sensitizer for increasing sensitivity to exposure light, on an underlayer region including a semiconductor substrate; irradiating the energy-ray-curable resin layer with energy rays to form a lower layer film containing the sensitizer; forming a resist film on the lower layer film; diffusing the sensitizer from the lower layer film into the resist film by thermal treatment; irradiating the resist film in which the sensitizer is diffused with exposure light; and developing the resist film irradiated with the exposure light.

Embodiments will be described hereinafter with reference to the accompanying drawings.

FIG. 1 to FIG. 9 are cross-sectional views pictorially showing a method of manufacturing a semiconductor device of the embodiments. The method of manufacturing a semiconductor device of the embodiments will be explained hereinafter with reference to FIG. 1 to FIG. 9.

First, as shown in FIG. 1, an underlayer region 11 including a semiconductor substrate (not shown) is coated with an energy-ray-curable resin solution containing a sensitizer for increasing sensitivity to exposure light ("EUV light" in the embodiments), to form an energy-ray-curable resin layer 12a. A photo-curable resin such as an ultraviolet-curable (UV-curable) resin, and an electron-beam-curable resin can be used as the energy-ray-curable resin. In other words, the resin which becomes curable by being irradiated with energy rays such as light and the electron beam can be used as the energy-ray-curable resin. A substance which generates secondary electrons by absorbing the exposure light can be used as the sensitizer.

In addition, an organic resin or an inorganic resin can be used as the energy-ray-curable resin. More specifically, the energy-ray-curable resin can be selected from a first resin, a second resin and a third resin explained below.

The first resin is an organic resin containing a sensitizer and a mixture of a photocationic polymerization initiator and a polymerizable compound containing at least one reactive group capable of cationic polymerization.

The second resin is an organic resin containing a sensitizer and a mixture of a photoradical polymerization initiator and a polymerizable compound containing at least one ethylenic unsaturated bond capable of radical polymerization.

The third resin is an inorganic resin containing a sensitizer and a mixture of a photocationic polymerization initiator or photoradical polymerization initiator and an energy-ray-polymerizable compound containing an oxide as a main component. For example, a silicon oxide such as spin-on-glass (SOG) and a metal oxide such as a titanium oxide and a tungsten oxide can be used as the oxide.

In the present embodiments, the photo-curable resin containing a highly photoabsorbent sensitizer having a high photoabsorption to the EUV light is used as the energy-ray-curable resin. For example, an iodine compound can be used as the highly photoabsorbent sensitizer. The highly photoabsorbent sensitizer may be monomer or oligomer. A resin solution in a liquid state at a room temperature or a resin solution obtained by dissolving polymers into a solvent may be used as the photo-curable resin solution. A thickness of the photo-curable resin layer 12 is set to be in a range of, for example, approximately 5 to 100 nm.

Next, as shown in FIG. 2, the energy-ray-curable resin layer 12a is irradiated with energy rays 13 and is cured at a room temperature. A lower layer film 12b containing the sensitizer is thereby formed on the underlayer region 11. The UV light is used as the energy rays 13. A high-pressure mercury lamp (wavelengths: 250 to 320 nm and 365 nm), a low-pressure mercury lamp (wavelengths: 185 nm and 254 nm), an excimer lamp (wavelengths: 126 nm, 146 nm, 172 nm, 222 nm, and 308 nm), etc., can be used as the UV light source. After irradiated with energy rays 13, the lower layer film 12b may be subjected to baking at a lower temperature than a baking temperature set after the resist coating, if necessary.

Next, as shown in FIG. 3, the lower layer film 12b is coated with photoresist to form a resist film 14a. In the present embodiment, EUV resist is used as the photoresist. The coating method is, for example, spin coating. A thickness of the resist film 14a is set to be in a range of, for example, approximately 20 to 100 nm. The resist film 14a contains an acid generator which generates acid with energy of secondary electrons. Since the lower layer film 12b is cured by the energy ray irradiation, mixing of the lower layer film 12b and the resist film 14a is prevented.

Next, as shown in FIG. 4, the resist film 14a is subjected to thermal treatment (baking) at a temperature of approximately 100 to 150° C. The solvent remaining in the resist film 14a is removed by the thermal treatment. In addition, the sensitizer is diffused from the lower layer film 12b into the resist film 14a by the thermal treatment. In the step of FIG. 2, curing is executed by energy ray irradiation at forming the lower layer film 12b. For this reason, the energy-ray-curable resin is not exposed at a high temperature in the step of FIG. 2. The sensitizer contained in the lower layer film 12b can be therefore diffused effectively from the lower layer film 12b into the resist film 14a by the thermal treatment (baking) of this step. Consequently, a resist film 14b containing the sensitizer can be obtained.

The sensitizer contained in the lower layer film 12b is diffused from a lower surface to an upper surface of the resist film 14b. For this reason, concentration of the sensitizer diffused into the resist film 14b is decreased from the lower surface toward the upper surface of the resist film 14b. In other words, the concentration of the sensitizer diffused into the resist film 14b is increased from the upper surface toward the lower surface of the resist film 14b.

Figure 10:
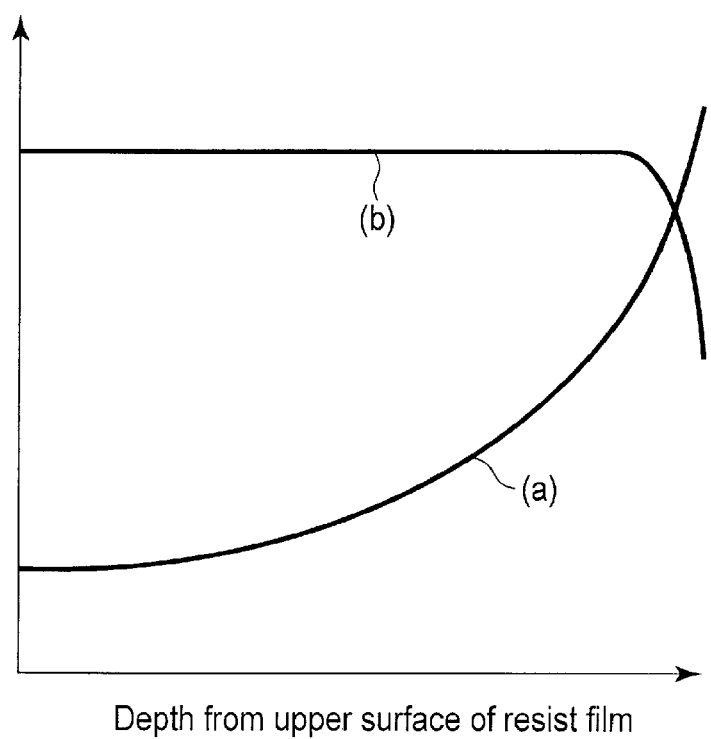
FIG. 10 is a graph showing examples of a light absorption coefficient and the number of absorbed photons in a resist film.

FIG. 10 is a graph showing examples of a light absorption coefficient and number of absorbed photons in the resist film 14b. (a) in FIG. 10 indicates the light absorption coefficient of the resist film 14b per unit depth, and (b) in FIG. 10 indicates the number of absorbed photons of the resist film 14b per unit depth. (a) in FIG. 10, light absorption coefficient, is substantially proportional to the concentration of the sensitizer in the resist film 14b. (a) in FIG. 10 therefore corresponds to a concentration profile of the sensitizer in the resist film 14b.

As shown in FIG. 10, the concentration of the sensitizer in the resist film 14b should preferably be controlled such that the number of absorbed photons of the resist film 14b per unit depth is constant. The property as shown in FIG. 10 can be obtained by properly controlling the thermal treatment temperature and the thermal treatment time of the thermal treatment (baking) shown in FIG. 4. By forming the resist film 14b having the property as shown in FIG. 10, the amount of absorption of the exposure light in the depth direction (thickness direction) of the resist film 14b can be uniformed.

Thus, a structure comprising the lower layer film 12b of the energy-ray-curable resin, which is formed on the underlayer region 11 and which contains the sensitizer to increase the sensitivity to the exposure light, and the resist film 14b which is disposed on the lower layer film 12b and which contains the sensitizer of the same type as the sensitizer contained in the lower layer film 12, can be obtained.

Next, as shown in FIG. 5, the resist film 14b in which the sensitizer is diffused is irradiated with exposure light 15, which is the EUV light. In other words, the resist film 14b is irradiated with the EUV light via a photolithographic mask having a desired pattern (circuit pattern). A desired pattern is thereby transferred to the resist film 14b.

The sensitizer diffused from the lower layer film 12b is contained in the resist film 14b. The sensitizer contained in the resist film 14b absorbs the exposure light (EUV light) and generates the secondary electrons. Then, acid is generated from the acid generator contained in the resist film 14b by the energy of the secondary electrons. As already explained, the concentration of the sensitizer is increased from the upper surface toward the lower surface of the resist film 14b, and the resist film 14b has the property as shown in, for example, FIG. 10. The amount of the absorbed exposure light in the depth direction (thickness direction) of the resist film 14b is therefore uniformed.

Furthermore, the resist film 14b to which the desired pattern is transferred is subjected to post-exposure bake.

Next, as shown in FIG. 6, the resist film 14b irradiated with the exposure light (EUV light) and subjected to post-exposure bake is developed. A resist pattern 14c is thereby formed. If the resist film 14b is a positive resist, an alkali aqueous solution such as a tetramethyl ammonium hydroxide aqueous solution of 2.38% concentration can be used as a chemical for the development. If the resist film 14b is a negative resist, an organic solvent such as n-butyl alcohol can be used.

The exposure light may not sufficiently reach the lowermost portion of the resist film 14b in the exposure step of FIG. 5. For this reason, if the resist film 14b is a positive resist, the lowermost portion of the resist film 14b may remain in the developing step. However, the remaining part of the lowermost portion of the resist film 14b can be removed by dry etching in a subsequent step. In addition, if the resist film 14b is a negative resist, the lowermost portion of the resist film 14b may be dissolved. However, dissolution of the resist film 14b can be prevented by containing an acidic substance in the lower layer film 12b.

Next, as shown in FIG. 7, the lower layer film 12b is subjected to dry etching using the resist pattern 14c as a mask. A lower layer film pattern 12c is thereby formed. Plasma of oxygen, nitrogen, hydrogen, water, halogen-based gas, sulfur compound, etc., can be used for the dry etching. An appropriate dry etching gas can be used in accordance with the type of the lower layer film 12b.

Figure 8:
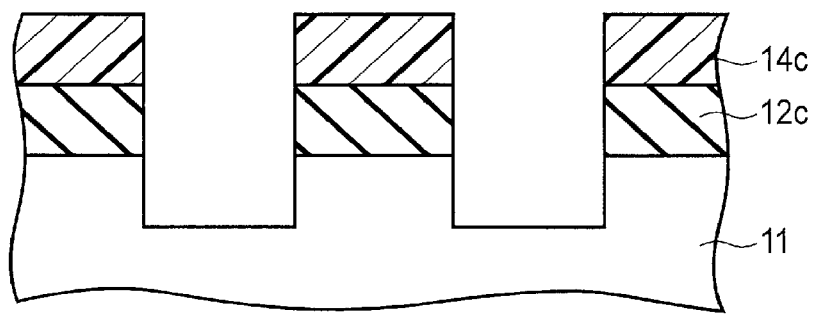
FIG. 8 is a cross-sectional view pictorially showing in part the method of manufacturing the semiconductor device of the embodiments.

Next, as shown in FIG. 8, the underlayer region 11 is etched by using the resist pattern 14c and the lower layer film pattern 12c as masks. The circuit pattern is thereby formed on the underlayer region 11.

Figure 9:
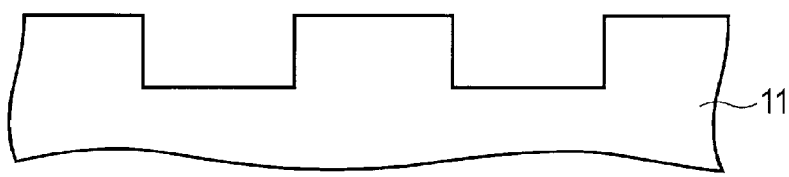
FIG. 9 is a cross-sectional view pictorially showing in part the method of manufacturing the semiconductor device of the embodiments.

Next, as shown in FIG. 9, the circuit pattern is left on the underlayer region 11 by removing the resist pattern 14c and the lower layer film pattern 12c.

In the embodiments, as explained above, the lower layer film 12b is formed from the energy-ray-curable resin and is cured by the energy ray irradiation. For this reason, the lower layer film 12b is not exposed at a high temperature until the diffusing step of FIG. 4 is executed. In other words, the lower layer film 12b is not exposed at a higher temperature than the thermal treatment temperature of FIG. 4 until the thermal treatment of FIG. 4 is executed. The sensitizer can be therefore easily diffused from the lower layer film 12b into the resist film 14a by the thermal treatment of FIG. 4. Consequently, the sensitizer can be sufficiently contained into the resist film 14b.

In addition, in the embodiments, the sensitizer in the resist film 14b can be easily given a concentration profile increasing from the upper surface toward the lower surface of the resist film 14b. For this reason, the amount of the absorbed exposure light in the depth direction (thickness direction) of the resist film 14b can be uniformed in the exposing step of FIG. 5. A high-precision resist pattern can be therefore formed by the development.

In the above-explained embodiments, a topcoat film may be formed on the resist film 14a after the formation of the resist film 14a in the step of FIG. 3. Since the sensitizer in the resist film 14b can easily be an outgas component, occurrence of the outgas can be suppressed by forming a topcoat film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    forming an energy-ray-curable resin layer containing a sensitizer for increasing sensitivity to exposure light, on an underlayer region including a semiconductor substrate;
    curing the energy-ray-curable resin layer by irradiating the energy-ray-curable resin layer with energy rays to form a lower layer film containing the sensitizer from the energy-ray-curable resin layer;
    forming a resist film on the lower layer film;
    diffusing the sensitizer from the lower layer film into the resist film by thermal treatment;
    irradiating the resist film in which the sensitizer is diffused with exposure light; and
    developing the resist film irradiated with the exposure light.

2. The method of claim 1, wherein
concentration of the sensitizer diffused into the resist film is increased from an upper surface toward a lower surface of the resist film.

3. The method of claim 1, wherein
an amount per unit depth of the exposure light absorbed by the resist film in which the sensitizer is diffused is uniformed in a depth direction.

4. The method of claim 1, wherein
the sensitizer generates secondary electrons by absorbing the exposure light, and
the resist film contains an acid generator which generates acid with energy of the secondary electrons.

5. The method of claim 1, wherein
the energy-ray-curable resin layer is formed of a resin containing both the sensitizer and a mixture of a photocationic polymerization initiator and a polymerizable compound containing a reactive group capable of cationic polymerization.

6. The method of claim 1, wherein
the energy-ray-curable resin layer is formed of a resin containing both the sensitizer and a mixture of a photoradical polymerization initiator and a polymerizable compound containing an ethylenic unsaturated bond capable of radical polymerization.

7. The method of claim 1, wherein
the energy-ray-curable resin layer is formed of a resin containing both the sensitizer and a mixture of a photocationic polymerization initiator or photoradical polymerization initiator and an energy-ray-polymerizable compound containing an oxide as a main component.

8. The method of claim 1, wherein
the exposure light is EUV light.

9. The method of claim 1, wherein
the energy rays are light or electron beams.

10. The method of claim 1, wherein
the sensitizer is an iodine compound.

* * * * *